United States Patent
Uttwani et al.

(10) Patent No.: US 11,282,744 B2
(45) Date of Patent: Mar. 22, 2022

(54) ENHANCED INTERMETAL DIELECTRIC ADHESION

(71) Applicant: Systems On Silicon Manufacturing Co. Pte. Ltd., Singapore (SG)

(72) Inventors: Pankaj Kumar Uttwani, Singapore (SG); Shankaran Chelliah, Singapore (SG); Yee Ming Chan, Singapore (SG)

(73) Assignee: Systems On Silicon Manufacturing Co. Pte. Ltd., Singapore (SG)

( * ) Notice: Subject to any disclaimer, the term of this patent is extended or adjusted under 35 U.S.C. 154(b) by 94 days.

(21) Appl. No.: 16/587,071

(22) Filed: Sep. 30, 2019

(65) Prior Publication Data
US 2021/0098289 A1 Apr. 1, 2021

(51) Int. Cl.
*H01L 21/768* (2006.01)
*H01L 23/522* (2006.01)
*H01L 23/528* (2006.01)
*H01L 23/532* (2006.01)
*H01L 21/02* (2006.01)

(52) U.S. Cl.
CPC .... *H01L 21/76834* (2013.01); *H01L 21/0214* (2013.01); *H01L 21/02175* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/5329* (2013.01)

(58) Field of Classification Search
CPC ........... H01L 21/76834; H01L 23/5226; H01L 21/76816; H01L 23/5283; H01L 21/7685
See application file for complete search history.

(56) References Cited

U.S. PATENT DOCUMENTS

| 6,218,299 | B1* | 4/2001 | Akahori | C23C 16/029 |
| | | | | 438/682 |
| 9,627,316 | B1* | 4/2017 | Chang | H01L 21/76831 |
| 2001/0051426 | A1* | 12/2001 | Pozder | H01L 24/11 |
| | | | | 438/666 |
| 2006/0276028 | A1* | 12/2006 | Park | H01L 21/76844 |
| | | | | 438/629 |

FOREIGN PATENT DOCUMENTS

WO  WO-2005096364 A1 * 10/2005 ............ H01L 24/03

OTHER PUBLICATIONS

Havemann, Robert, "High-Performance Interconnects: An Integration Overview", Proceedings of the IEEE, vol. 89, No. 5, May 2001, pp. 586-601 (Year: 2001).*

* cited by examiner

*Primary Examiner* — Selim U Ahmed
*Assistant Examiner* — Evan G Clinton
(74) *Attorney, Agent, or Firm* — Horizon IP PTE Ltd.

(57) ABSTRACT

Device and method of forming the device are disclosed. A semiconductor device includes a back-end-of-line dielectric (BEOL) with a plurality of IMD levels over a substrate processed with front-end-of-line components. The BEOL includes an upper IMD level and upper metal lines, with a buffer layer over the upper metal lines. The buffer layer improves adhesion of the upper IMD layer which covers the upper metal lines. Improving the adhesion of the upper IMD layer improves the reliability of the device.

20 Claims, 9 Drawing Sheets

ENHANCED INTERMETAL DIELECTRIC ADHESION

BACKGROUND

In integrated circuits (ICs), back-end-of-line (BEOL) processing forms metal lines in metallization layers to interconnect circuit components, such as transistors, resistors, and capacitors formed on a substrate. For example, inter-metal dielectric (IMD) layers include via contacts which interconnect the metal lines of different metallization layers to the circuit components. Advanced ICs, particularly those used for power applications in portable devices, require minimum resistive loss in the metal lines to reduce power consumption and improve battery performance. To satisfy resistance requirements, the top metal level generally has the thickest and widest metal lines of the BEOL metal stack.

The difference in material properties of metals and IMD layers generates stress. Due to increased thickness of the metal lines, the corresponding subsequent IMD layer needs to be thicker in order to cover the thick metal line as well as for stress balancing. We have observed that the high stress of thicker IMD layers may lead to delamination and/or cracks therein, posing potential reliability issues.

From the foregoing discussion, it is desirable to provide a BEOL stack which is reliable and avoids the issues of conventional BEOL stacks.

SUMMARY

Embodiments of the present disclosure generally relate to semiconductor device and method of forming thereof. In one embodiment, the method includes providing a substrate processed by front-end-of-line (FEOL) processing. Back-end-of-line (BEOL) processing is performed on the substrate to form a plurality of intermetal dielectric (IMD) levels including lower IMD levels and at least one upper IMD level. The forming of the upper IMD level includes forming an upper conductive line on an uppermost lower IMD level. The upper conductive line is configured to have an upper conductive line thickness which is greater than a lower conductive line thickness of lower conductive lines of the lower IMD levels. The upper conductive line further includes a buffer layer is on a top upper conductive line surface and forms an upper conductive line stack. The forming of the upper IMD level continues by an upper IMD layer covering the upper conductive line stack and the upper IMD layer has an upper IMD thickness which is thicker than a lower IMD thickness of lower IMD layers of the lower IMD levels. The buffer layer is configured to improve adhesion of the upper IMD layer to the upper conductive line stack.

In one embodiment, the device includes a substrate with FEOL components and a back-end-of-line (BEOL) dielectric including a plurality of intermetal dielectric (IMD) levels. The BEOL dielectric includes an upper IMD level over lower IMD levels which include lower conductive lines. The upper IMD level includes an upper conductive line on an uppermost lower IMD level and the upper conductive line has an upper conductive line thickness which is greater than a lower conductive line thickness of the lower conductive lines of the lower IMD levels. The upper IMD level further includes a buffer layer disposed on the upper conductive line, and an upper IMD layer disposed over the upper conductive line. The buffer layer improves adhesion of the upper IMD layer to the upper conductive line.

In one embodiment, the method includes providing a substrate processed by front-end-of-line (FEOL) processing. Back-end-of-line (BEOL) processing is performed to form a plurality of intermetal dielectric (IMD) levels which includes forming lower IMD levels and at least one upper IMD level. The lower IMD levels include lower conductive lines. Forming the upper IMD level includes forming an upper conductive layer on an uppermost lower IMD level, and the upper conductive layer includes an upper conductive layer thickness which is equal to an upper conductive line thickness while the upper conductive line thickness is greater than a lower conductive line thickness of the lower conductive lines of the lower IMD levels. Forming the upper IMD level continues by forming a buffer layer on the upper conductive layer, patterning the upper conductive layer and buffer layer to form an upper conductive line stack, and forming an upper IMD layer over the upper conductive line stack. The upper IMD layer is configured to have an upper IMD thickness which is thicker than a lower IMD thickness of lower IMD layers of the lower IMD levels and the buffer layer is configured to improve adhesion of the upper IMD layer to the upper conductive line stack.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to semiconductor devices, such as integrated circuits (ICs). More particularly, embodiments relate to reliable interconnects in ICs. The ICs can be any types of ICs. The devices or ICs may be incorporated into or used with, for example, consumer electronic products, or other types of products.

Semiconductor fabrication, such as complementary metal oxide semiconductor (CMOS) fabrication, forms a plurality of devices on a wafer. The fabrication process may involve the formation of features on the wafer which correspond to the circuit components, such as transistors, resistors, and capacitors. The devices are interconnected, enabling the IC to perform the desired functions. After wafer processing is completed, the wafer is diced to singulate the devices.

Figure 1:
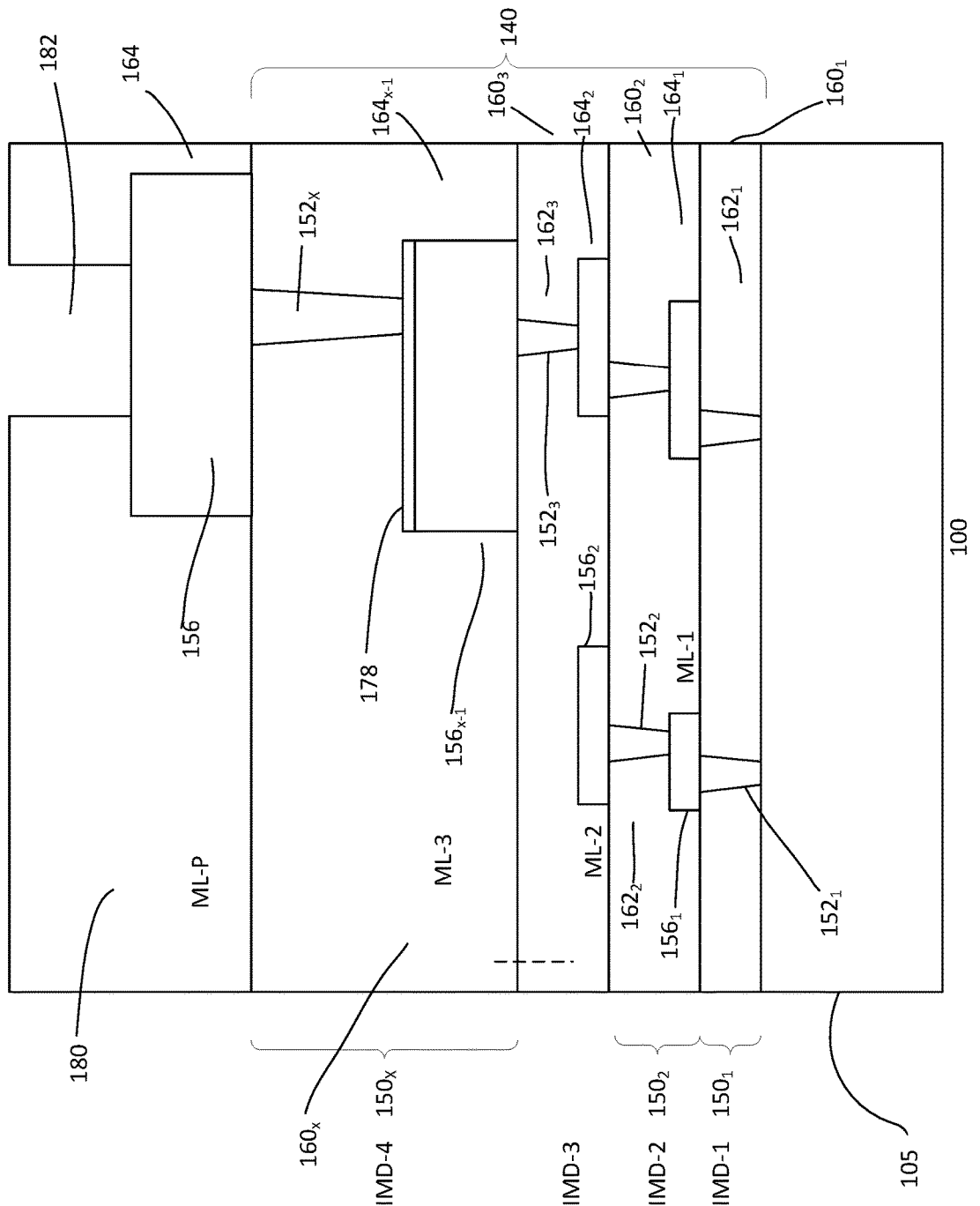
FIG. 1 shows a simplified cross-sectional view of an embodiment of a device.

FIG. 1 shows a simplified cross-sectional view of an embodiment of a device 100. The device is formed on a substrate 105. The substrate, for example, is a part of a semiconductor wafer, such as a silicon wafer. The wafer may be a lightly doped p-type wafer. Other types of wafers, such as a silicon-on-insulator (SOI), or silicon germanium wafer as well as a wafer doped with other types of dopants or dopant concentrations may also be useful.

The substrate is processed to form different device regions with components. For example, front-end-of-line (FEOL) processing is performed on the substrate. FEOL processing may include forming isolation regions to isolate different device regions. The device regions may include high voltage (HV), low voltage (LV) and intermediate or medium voltage (MV) regions or a combination thereof. High voltage devices or components are formed in the high voltage region, low voltage components are formed in the low voltage region and intermediate voltage components are formed in the intermediate voltage region. The components may be metal oxide semiconductor (MOS) transistors. Other types of components or device regions may also be useful. For example, resistor and/or capacitor regions may be formed for resistors and capacitors. The isolation regions may be shallow trench isolation (STI) regions. Other types of isolation regions may also be useful. The isolation regions are provided to isolate device regions from other regions. The FEOL processing may further include forming device wells which may be formed for p-type and n-type transistors for a complementary MOS (CMOS) device. Separate implants may be employed to form different doped wells using, for example, implant masks, such as photoresist masks.

After forming the wells, gates of transistors may be formed on the substrate. The gates are formed by, for example, forming a gate oxide layer, such as a thermal silicon oxide layer, followed by a gate electrode layer, such as a polysilicon layer. The gate electrode may be doped. Other types of gate materials may also be useful. Separate processes may be performed for forming gate dielectrics of the different voltage transistors. This is due to, for example, different gate oxide thicknesses associated with the different voltage transistors. For example, an HV transistor will have a thicker gate dielectric than an LV transistor. The gate layers may be patterned to form gates. For example, a photoresist mask may be used for a reactive ion etch (RIE) to pattern the gate layers to form the gates.

After forming the gates, source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions, and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist masks. Other types of components may also be formed, such as capacitors and resistors.

Back-end-of-line (BEOL) processing is performed after forming the transistors. The BEOL process includes forming interconnects in a BEOL dielectric 140. The interconnects connect the various components of the IC to perform the desired functions. The BEOL dielectric includes a plurality of intermetal dielectric (IMD) levels $150_{1-x}$. An IMD level includes an IMD layer 160 with at least a contact or a via level having via contacts 152. In the case of the first IMD level (IMD-1), the IMD layer $160_1$ includes a first contact level $162_1$ with first contacts $152_1$. The first contacts are coupled to contact regions on the substrate. The substrate contact regions may include S/D regions and gates of transistors, well taps, as well as other types of contact regions, including electrodes of capacitors and resistors. In the case of IMD levels above IMD-1, the IMD layer includes a via level i above a metallization level (ML) i-1 with metal lines, where i is from 2 to x. For example, in the case of IMD-2, second via contacts $152_2$ are coupled to the first metal lines $156_1$ of a first metallization level ML-1.

The IMD layers may be silicon oxide layers or other types of dielectric layers. The IMD layers of the different IMD levels, although not necessary, may be the same type of dielectric layers. As for the metal lines and via contacts, they may be formed of tungsten, aluminum, copper or other types of conductive materials. For example, the metal lines may be aluminum lines while contacts may be tungsten contacts. Providing other types of metal lines or contacts may also be useful. The metal lines of the different IMD levels may be the same type of metal lines, such as aluminum lines; the contacts of the different IMD levels may be the same type of contacts, such as tungsten contacts. Other configurations of the metal lines and contacts of the IMD levels may also be useful. For example, it is not necessary for the different IMD levels to have the same type of metal lines and the same type of contacts.

Illustratively, the BEOL dielectric includes 4 IMD levels $150_{1-x}$, where x=4. Providing the BEOL dielectric with other numbers of IMD levels may also be useful. The first IMD level (IMD-1) $150_1$ includes a first IMD layer $160_1$ with first via contacts $152_1$. For example, the first IMD level only includes a first contact level $162_1$. The first IMD layer of IMD-1 covers the circuit components over the substrate while the contacts are coupled to contact regions, such as gates, S/D regions, well taps or other types of contact regions. The IMD layer may be a plasma enhanced chemical vapor deposited (PECVD) silicon oxide layer. Other types of dielectric layers may also be useful. As for the via contacts, they may be tungsten contacts. Other types of contacts may also be useful. A top surface of the first IMD layer is coplanar with the top surface of the first via contacts $152_1$.

Metal lines $156_1$ of a first metallization level (ML-1) $164_1$ are disposed over the first IMD layer of IMD-1. The metal lines may be aluminum metal lines. Other types of metal lines, such as copper lines, may also be useful. An IMD layer $160_2$ of the second IMD level (IMD-2) $150_2$ is disposed over IMD-1 and the metal lines of ML-1. For example, the second IMD layer of IMD-2 may serve as both ML-1 dielectric layer $164_1$ as well as the second contact via level dielectric layer $162_2$. The second via contacts $152_2$ are disposed in IMD-2 and are coupled to the metal lines of ML-1. Similar to IMD-1, the second IMD layer of IMD-2 includes a top surface which is coplanar with the top surface of the via contacts $152_2$. The via contacts, for example, may be tungsten contacts. Other types of contacts may also be useful.

The third IMD level (IMD-3) may be similar to IMD-2. For example, the third IMD layer of IMD-3 covers the metal lines of the second metallization level (ML-2) $164_2$ and includes third via contacts $152_3$ in the third contact level $162_3$ coupled thereto. The metal lines may be aluminum lines while the contacts may be tungsten contacts. Other types of metal lines or contacts, as well as other configurations of IMD-3, may also be useful. The dimensions of metal lines, such as width and thickness, of the lower metallization levels, such as ML-1 and ML-2, may be the same or similar. For example, in the case of a 180 nm technology node, the metal lines may have a thickness of about 230-580 nm and a width of about 170-430 nm. As for the thickness of the lower IMD layers, such as IMD-2 and IMD-3, it may be about 560-1410 nm, which includes the contact level and metal level. For example, the contact level may have a thickness of about 430-980 nm while that of the metal level may be about 230-580 nm. Other dimensions may also be useful for lower metallization levels and IMD layers.

The contact level thickness is equal to the height of the contacts while the metal level thickness is equal to the thickness of the metal lines. Furthermore, as described, an IMD level includes the dielectric layer between the substrate and top of a contact level or a top of one contact level to the top of the next contact level. As such, the thickness of the IMD level is equal to either the thickness of the dielectric layer between the substrate and top of the first contact level or between the top of the contact of $IMD_{x-1}$ and the top of the contact of $IMD_x$. Other configurations of designating IMD levels may also be useful. For example, the IMD layer may be defined to include a metal level and contact level below. Furthermore, an IMD layer may be a single dielectric layer, multiple dielectric layers or a combination thereof.

As shown, a third metallization level (ML-3) $164_{x-1}$ is disposed over the IMD layer of IMD-3. ML-3 includes metal lines $156_{x-1}$, such as aluminum metal lines. Other types of metal lines may also be useful. ML-3 may be considered an upper or top metallization level. As illustrated, the BEOL includes only one upper metallization level. However, it is understood that there may be more than one upper metallization level. Metal lines of an upper metallization level have dimensions which are larger than those of the lower metallization layers. The dimensions of an upper metallization level may be about 8 to 10 times the thickness of metal lines in the lower metallization levels, such as ML-1 and ML-2. For example, in the case of a 180 nm technology node, upper metal lines may be about 5 to 12 times the thickness of the lower metallization and a width which may be about 7 to 13 times that of the lower metallization. As a result, the metal lines of an upper metallization level has a more relaxed critical dimension (CD) than the metal lines of the lower metallization levels.

The thicker upper metal lines are required to satisfy minimum resistive loss requirements. In one embodiment, the upper metal line dimension, such as thickness and width, may be determined by the cumulative current requirements of the device. In addition, the upper metal lines need to withstand high pressure bonding or bumping process to make final connections to other chips, for example, via a printed circuit board (PCB).

In one embodiment, a fourth or top IMD layer $160_x$ of the fourth IMD level (IMD-4) $150_x$ is disposed over the IMD layer of IMD-3 and the ML-3 metal lines. The fourth IMD layer is thicker than IMD layers of the lower IMD levels, such as IMD-1, IMD-2, and IMD-3. The thickness of an upper IMD layer, such as IMD-4, may be about 5100-6500 nm. This, for example, is about 4-12 times thicker than the lower IMD layers. The thicker top IMD layer is configured to balance the stress of the overall BEOL dielectric.

In one embodiment, the upper metal lines include a buffer layer 178. The buffer layer serves as an adhesion layer to reduce the risk of delamination of the upper IMD layer from the upper metal lines. In addition, the buffer layer reduces the risk of cracks in the upper IMD layer. Further, the buffer layer improves reliability of the BEOL dielectric. In one embodiment, the buffer layer is a silicon oxynitride (SiON) layer. Other types of buffer layers which enhance adhesion of the IMD layer may also be useful. For example, other types of metal oxides can also be used for the buffer layer. The buffer layer should be sufficiently thick to enhance adhesion between the IMD layer and top metal lines. In one embodiment, the thickness of the buffer layer is about 30 nm. Other thicknesses which enhance adhesion may also be useful. The thickness may depend on, for example, the type of material employed.

Via contacts $152_x$ are disposed on the contact level of IMD-4. The via contacts, for example, are tungsten contacts. Other types of via contacts may also be useful. In one embodiment, the via contacts and IMD dielectric layer have coplanar top surfaces.

In one embodiment, pad metal lines 156 of a pad metallization level (ML-P) 164 are disposed on the top dielectric layer of IMD-4. The pad metal lines, for example, may be aluminum pad lines and have similar dimensions as the upper metal lines. For example, the pad metal lines may have relaxed CD compared to the lower metal lines of the lower metallization levels. A passivation layer 180 is disposed over the pad metal lines and IMD-4. In one embodiment, the passivation layer is silicon oxide. In some cases, the passivation layer may be a passivation stack having multiple passivation layers. For example, a combination of silicon oxide and silicon nitride can be used for the multiple passivation layers. Other configurations of the passivation stack may also be useful. Pad openings 182 are provided in the passivation layer to expose pad positions of the pad metal lines.

Figure 2A:
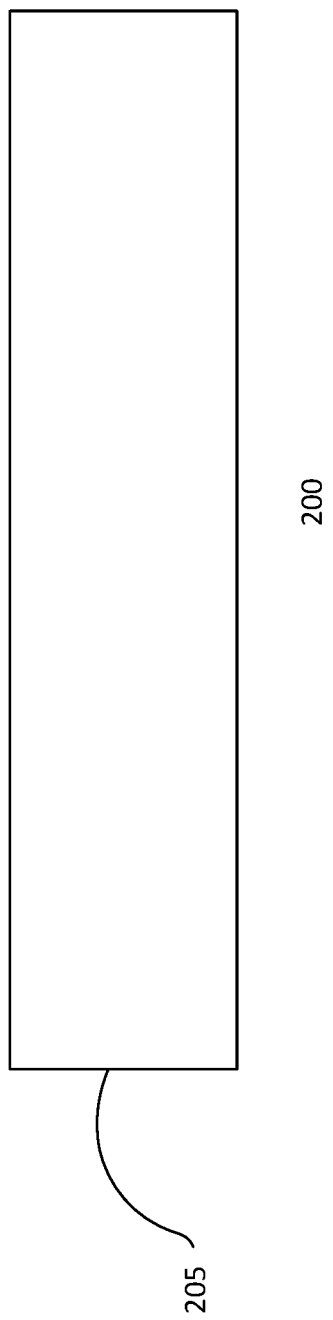
FIGS. 2a-2h show simplified cross-sectional views of an embodiment of a process for forming a device.

FIGS. 2a-2h show simplified cross-sectional views of a process of forming a device 200. The device is similar to that described in FIG. 1. Common elements may not be described or described in detail. Referring to FIG. 2a, a substrate 205 is provided. The substrate, for example, is a part of a semiconductor wafer, such as a silicon wafer. Other types of wafers, such as a silicon-on-insulator (SOI), or silicon germanium wafer may also be useful. FEOL processing is performed on the substrate. For example, the substrate is processed to form different device regions with circuit components, such as different types of transistors, capacitors, resistors or a combination thereof. The FEOL processed substrate includes various contact regions, such as gates, S/D regions, well taps, capacitor electrodes, resistor electrodes or a combination thereof.

Figure 2B:
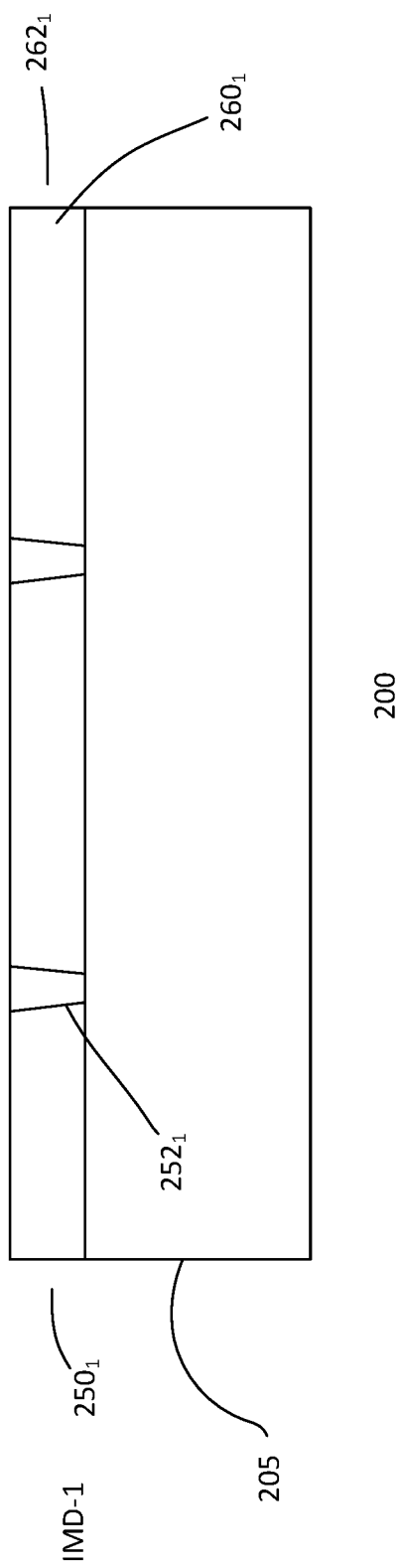

In FIG. 2b, an IMD layer $260_1$ is formed on the substrate. For example, a first IMD layer of the first IMD level (IMD-1) $250_1$ is formed on the substrate. The IMD layer, for example, is a silicon oxide layer. The IMD layer may be deposited on the substrate by PECVD. Other types of IMD layers or deposition techniques may also be employed. The IMD layer covers the substrate and circuit components, including contact regions on the substrate. A planarization process, such as chemical mechanical polishing (CMP), may be performed on the IMD layer to form a planar top surface. Other types of planarization processes may also be useful.

The first IMD layer $260_1$ includes a first contact level $262_1$. The via contacts $252_1$ are formed in the first contact level $262_1$ of the first IMD layer $260_1$. The via contacts are in electrical communication with the contact regions. In one embodiment, the via contacts are formed by a damascene process. The damascene process, for example, includes first forming via openings in the IMD layers aligned to contact regions. The openings may be formed by conventional lithographic techniques which form a resist mask on the first IMD layer. An RIE is performed to form the via openings in the IMD layer, exposing the contact regions. The resist mask is removed after forming the via openings, such as by ashing. A conductive layer, such as tungsten, is deposited on the substrate, filling the via openings and covering the IMD layer. The conductive layer is deposited by sputtering. Other types of conductive layers or deposition techniques may also be useful. A planarizing process, such as CMP, is performed to remove excess conductive material, leaving via contacts in the via openings. The CMP forms a coplanar top surface between the top of the IMD layer and the top of the via contacts.

Figure 2C:
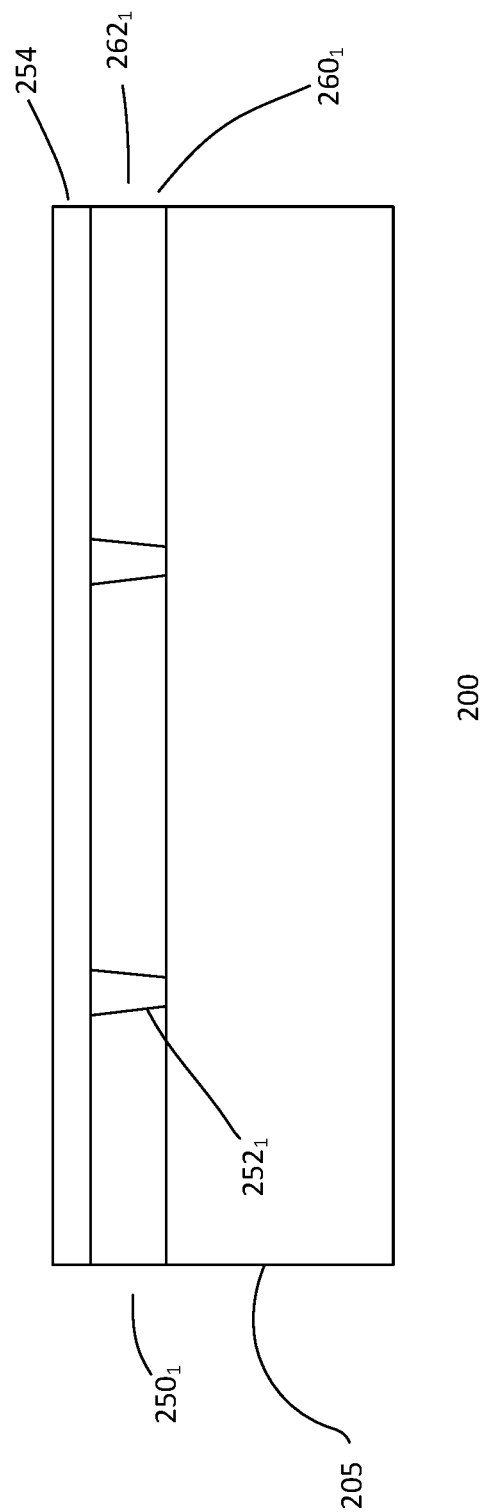

As shown in FIG. 2c, a conductive layer 254 is formed on the first IMD layer $260_1$. The conductive layer, for example, may be an aluminum layer formed by sputtering. Other types of conductive layers or deposition techniques may also be useful.

Figure 2D:
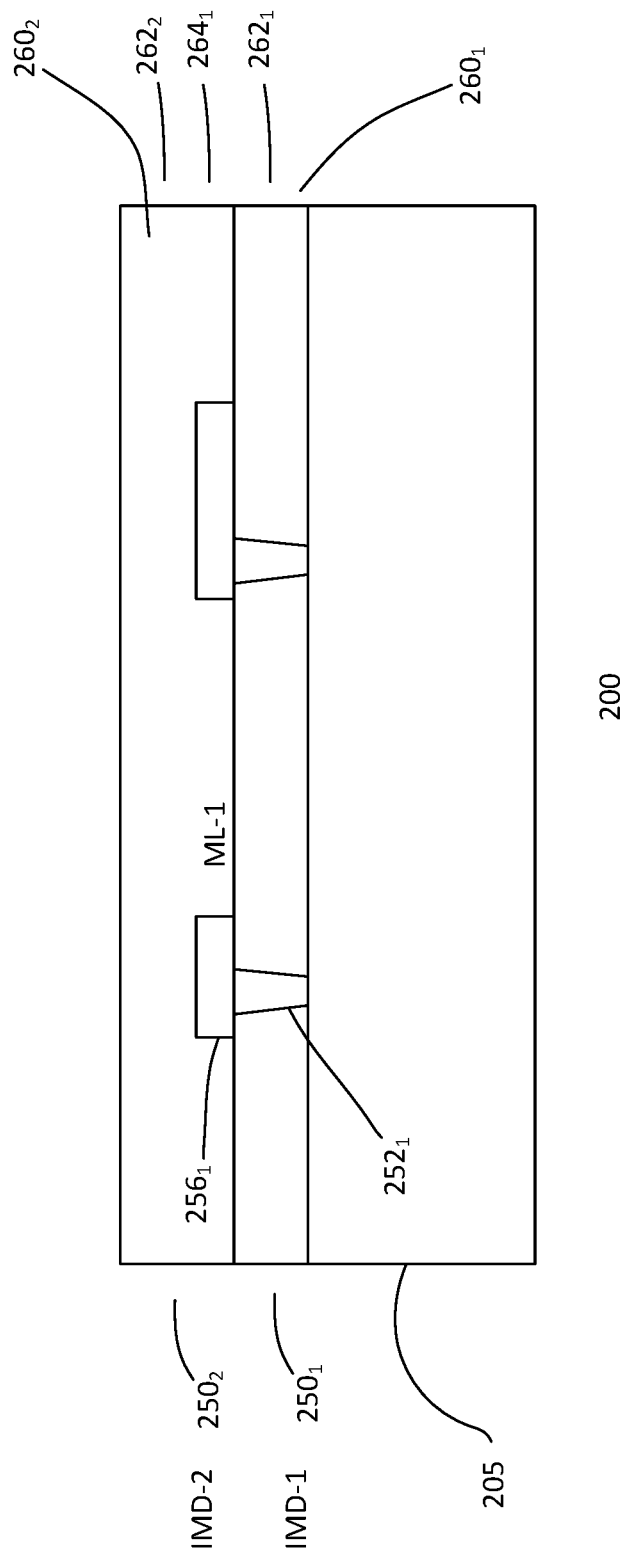

Referring to FIG. 2d, the conductive layer 254 is patterned to form first metal lines $256_1$ of the first metallization level (ML-1) $264_1$. In one embodiment, the conductive layer is patterned using RIE technique. The RIE technique includes forming a resist layer, patterning the resist layer using photolithography, and developing the resist layer to form an etch mask. An RIE is performed using the etch mask to form the metal lines $256_1$. A second IMD layer $260_2$ of the second IMD level (IMD-2) $250_2$ is formed on the first IMD layer, covering the first IMD layer and first metal lines $256_1$. The IMD layer may be silicon oxide formed by PECVD. Other types of IMD layers and forming techniques may also be useful. A lower portion of the second IMD layer may serve as the first metallization level dielectric $264_1$ and the upper portion of the second IMD layer may serve as the second contact level dielectric $262_2$.

Figure 2E:
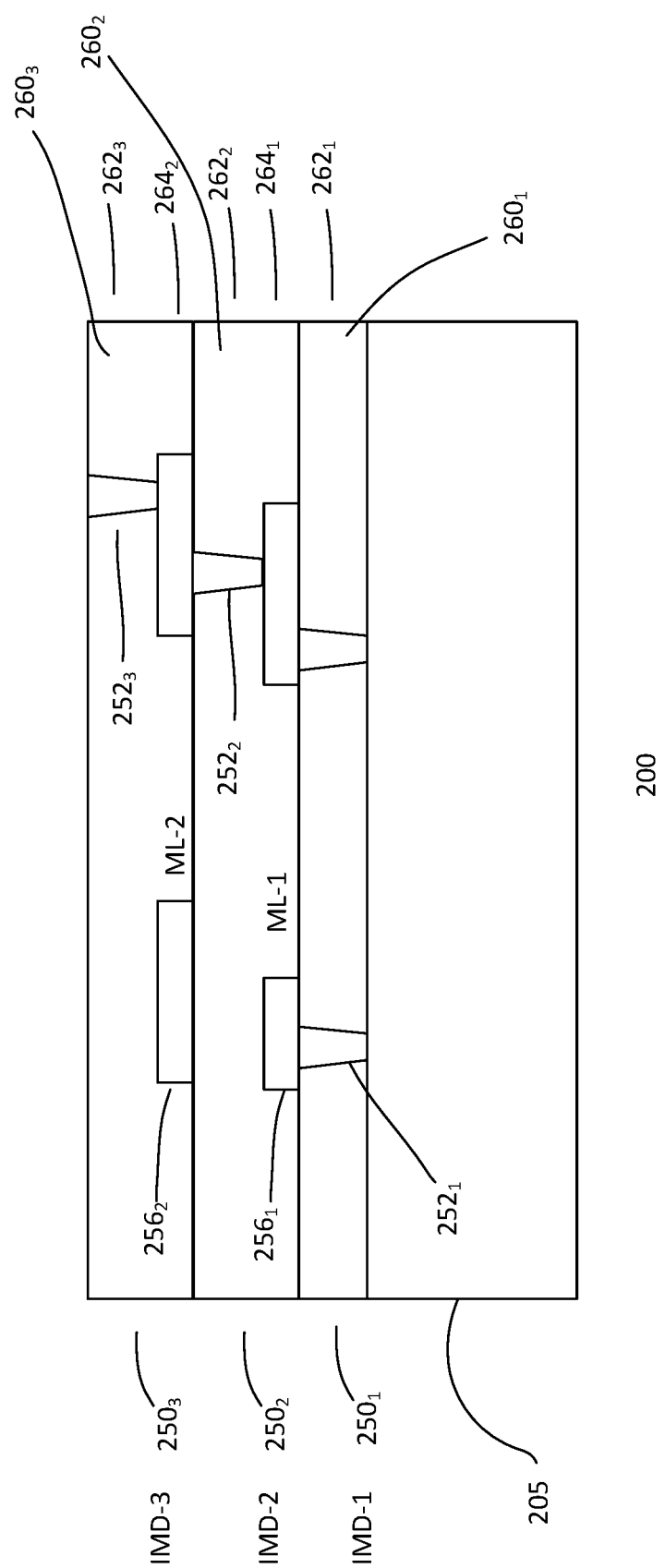

As shown in FIG. 2e, the process continues to form via contacts $252_2$ of the second contact level dielectric, metal lines $256_2$ of the second metallization level (ML-2) $264_2$, a third IMD layer (IMD-3) $260_3$, and via contacts $252_3$ of the third contact level $262_3$. The process is similar to that previously described in forming the contacts, metal lines, and IMD layers. For example, second metal lines of ML-2 are formed by deposing a metal layer on IMD-2 and patterned by RIE. After the second metal lines are formed, a third IMD layer of IMD-3 is formed and planarized. Third via contacts of IMD-3 are formed in the IMD layer by forming vias and filling it with a conductive layer. Excess conductive layer is removed by, for example, CMP, forming third via contacts having a planar top surface with the third IMD layer. In the case that there are more of the lower IMD levels, additional lower IMD levels may be formed, similar to that of IMD levels 1 and 2.

Figure 2F:
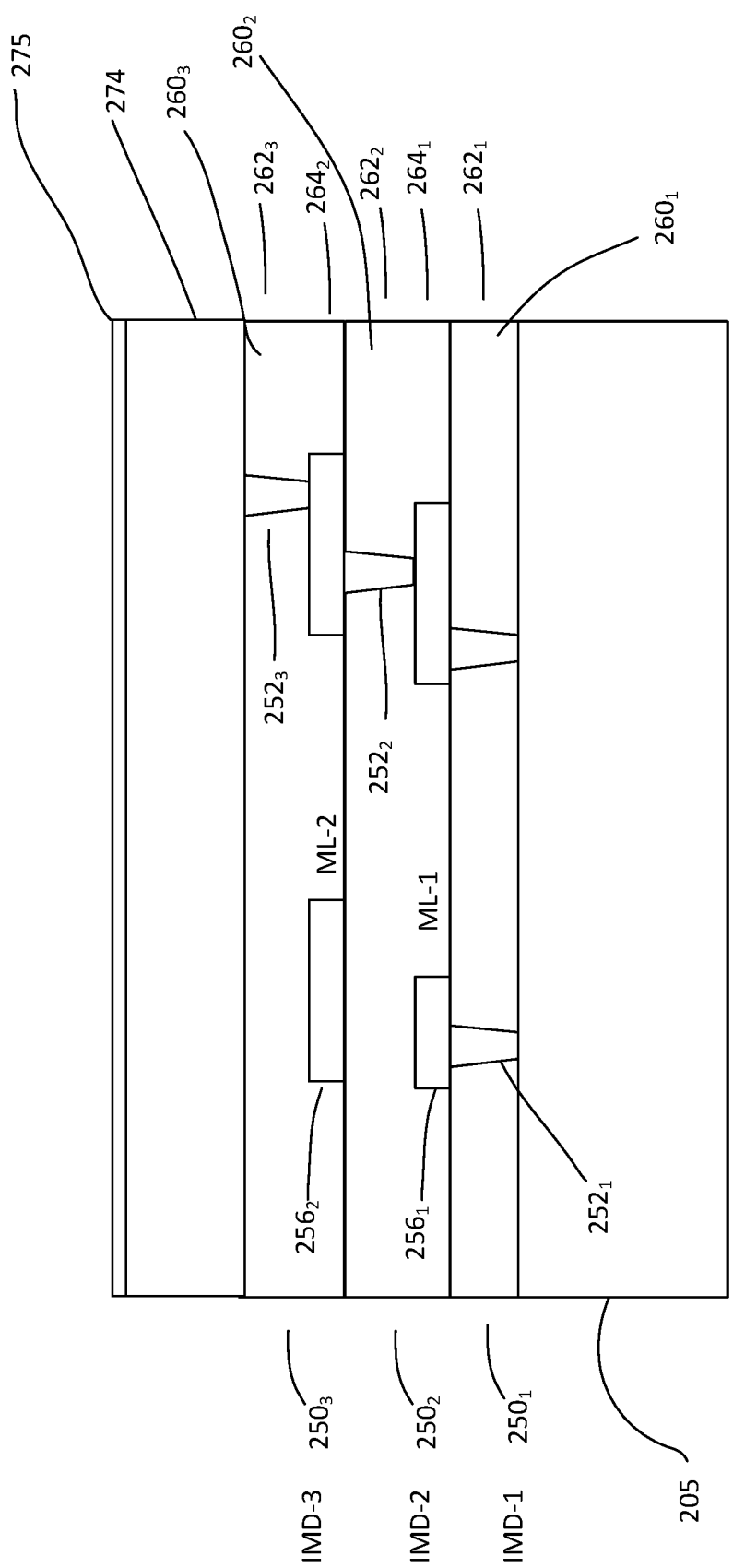

Referring to FIG. 2f, the process of forming upper or top metal lines is performed. In one embodiment, a metal layer 274 is deposited on the lower IMD layer, such as the third IMD layer. The metal layer, for example, is an aluminum layer. As discussed, the upper or top metal layer is thicker and has a more relaxed CD than the lower metal lines. For example, the upper or top metal layer has a thickness of about 2300-4800 nm. Other thicknesses may also be useful. The upper or top metal layer is formed by, in one embodiment, sputtering. Other techniques for forming the top metal layer may also be useful.

In one embodiment, a buffer layer 275 is formed on the top metal layer. The buffer layer, in one embodiment, enhances adhesion of the subsequently formed IMD layer. In one embodiment, the buffer layer is a SiON layer. The buffer layer may be formed by CVD. Other types of buffer layers or forming techniques may also be useful. A thickness of the buffer layer is sufficient to enhance adhesion between the top metal layer and the subsequently formed IMD layer. The thickness of the buffer layer, for example, is about 30 nm. Other thicknesses may also be useful. The top metal layer and buffer layer form a top metal stack.

Figure 2G:
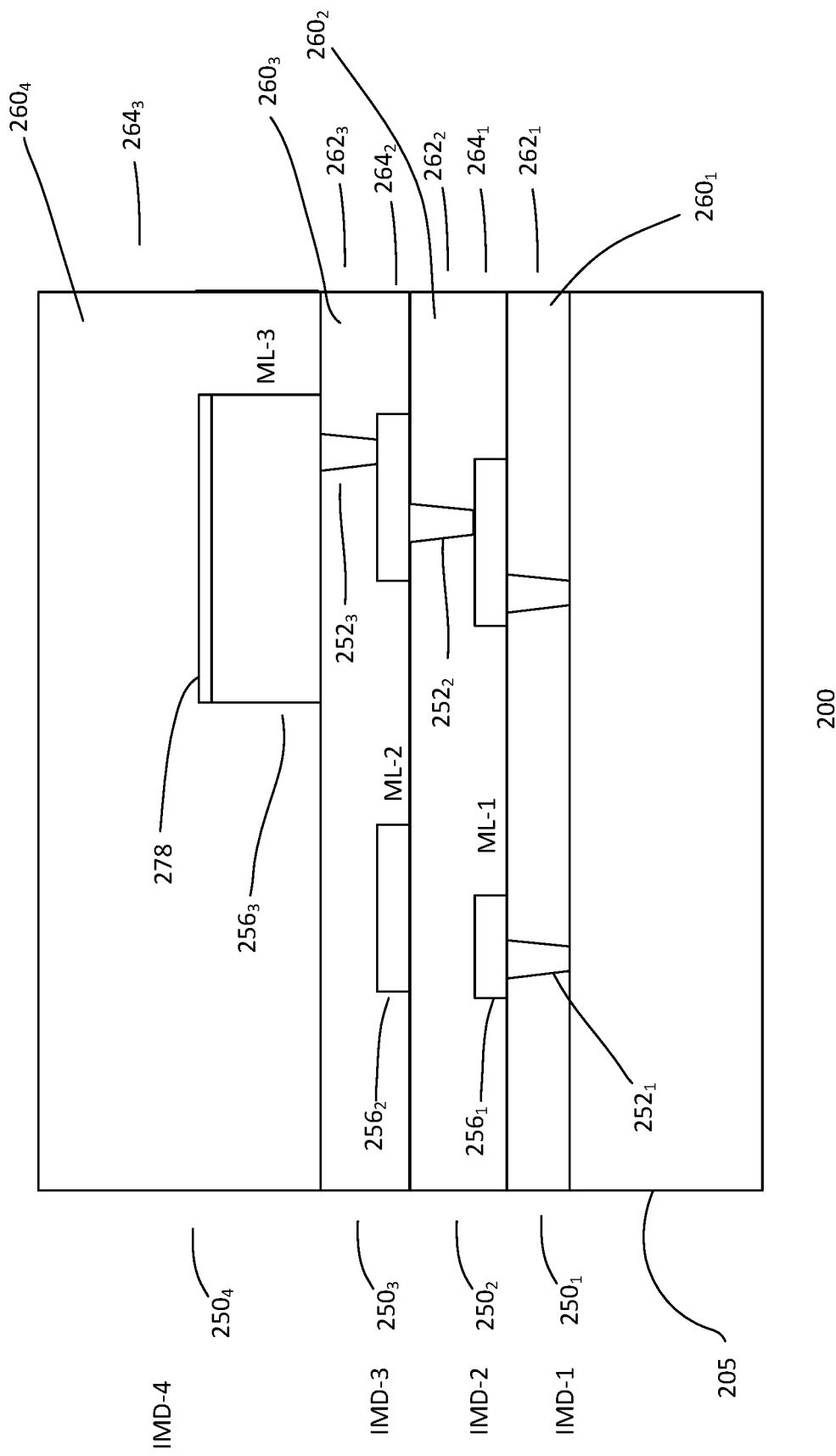

In FIG. 2g, the top metal stack is patterned to form top metal lines $256_3$ with a buffer layer 278. Patterning the top metal stack may be achieved by forming a photoresist layer thereon. The photoresist layer is exposed with an exposure source using a reticle with the desired pattern. The resist layer is developed, creating a mask pattern corresponding to the metal lines. An RIE is performed to remove exposed portions of the top metal stack. After RIE, the mask is removed, for example, by ashing. Other techniques for removing the mask is also useful. This leaves top metal lines with a buffer layer over the lower IMD layer $250_3$.

A top IMD layer $260_4$ is formed over the substrate, covering the lower IMD layer and top metal lines. For example, a fourth IMD layer of IMD-4 is formed. The top IMD layer may be a silicon oxide layer, such as a PECVD silicon oxide layer. Other types of dielectric layers may also be useful. The top IMD layer has a thickness which is about 5100-6500 nm. Other thicknesses may also be useful.

Figure 2H:
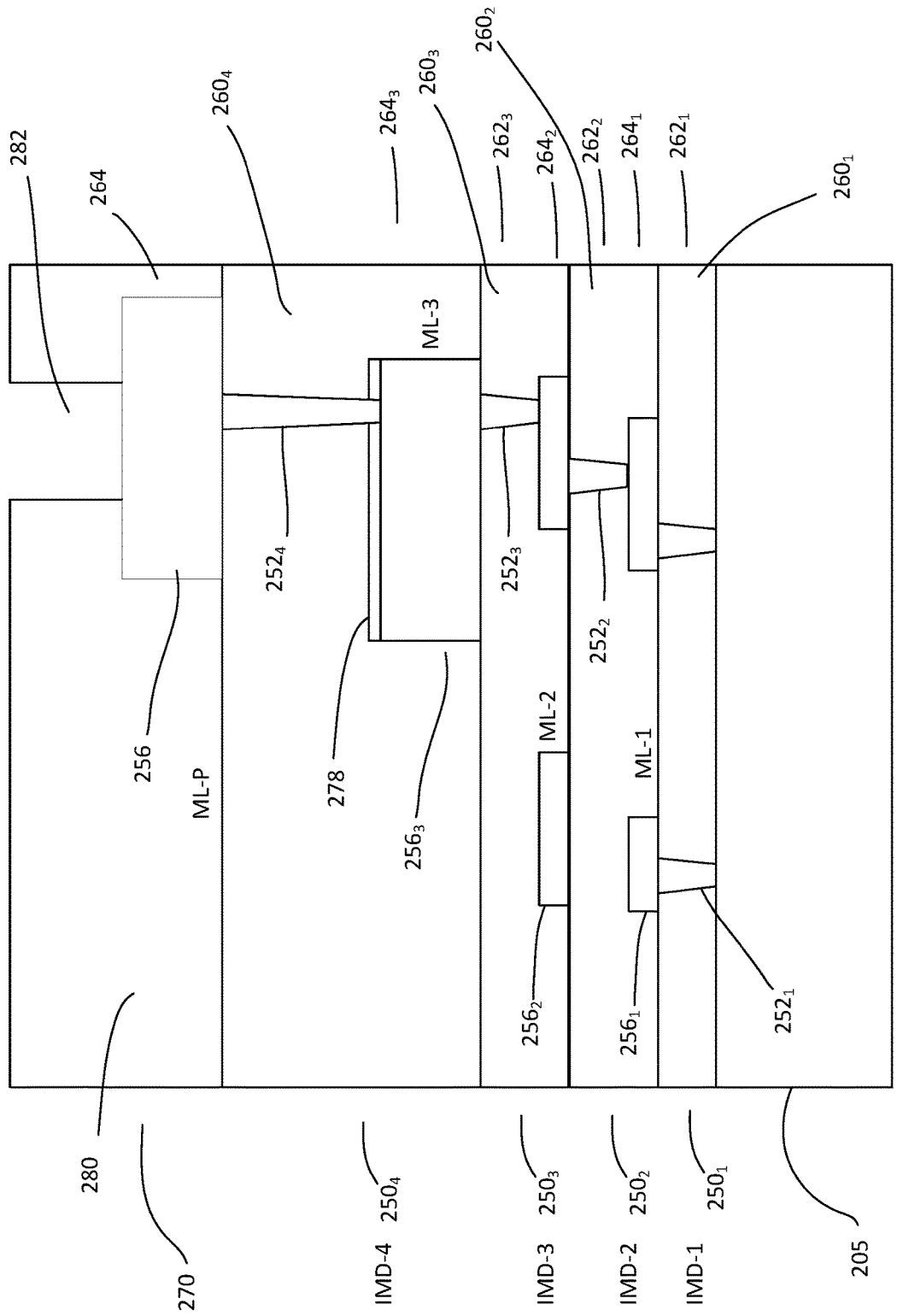

Referring to FIG. 2h, the process continues to form a pad level 270. The process includes, for example, forming pad lines 264 of a pad metal level ML-P. The pad lines may be formed by, for example, depositing a conductive pad layer, such as an aluminum layer, on IMD-4. Other types of pad layers may also be useful. The pad layer is patterned by mask and etch techniques to form pad lines. After the pad lines are formed, a passivation layer 280 is formed over the pad lines. The passivation layer, for example, may be a silicon oxide layer. Other types of passivation layers may also be useful. In some embodiments, the passivation layer includes a passivation stack. For example, the passivation stack may include a combination of silicon oxide and silicon nitride. Pad openings 282 are formed in the passivation layer to expose pad lines in the pad positions. The pad openings may be formed by, for example, mask and etch techniques.

As described, the BEOL employs RIE to form metal lines of metallization levels and damascene techniques to form via contacts of the different via contact levels. In other embodiments, via contacts and metal lines of a metal level above may be formed by dual damascene processes. In addition, the BEOL is described with 3 metallization levels and a pad level. Providing a BEOL with other numbers of metallization levels may also be useful.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A method of forming a device comprising:
   providing a substrate which has been processed by front-end-of-line (FEOL) processing; and
   performing back-end-of-line (BEOL) processing to form a plurality of intermetal dielectric (IMD) levels, wherein the BEOL processing includes forming lower IMD levels and at least one upper IMD level, wherein forming the upper IMD level comprises,
   forming an upper conductive line layer on an uppermost lower IMD level, wherein the upper conductive line layer comprises an upper conductive line thickness which is greater than a lower conductive line thickness of lower conductive lines of the lower IMD levels,
   forming a dielectric buffer layer on a top surface of the upper conductive line layer to form an upper conductive line layer stack, patterning the upper conductive line layer stack to form a patterned upper conductive line stack, wherein exposed side surfaces of the dielectric buffer layer and the upper conductive line layer of the patterned upper conductive line stack are aligned, and forming an upper IMD layer covering the patterned upper conductive line stack, wherein the upper IMD layer comprises a single dielectric layer which directly contacts a top surface of the dielectric buffer layer and the exposed aligned side surfaces of the dielectric buffer layer and the upper conductive line layer of the patterned upper conductive line stack, wherein the upper IMD layer has an upper IMD thickness which is thicker than a lower IMD thickness of lower IMD layers of the lower IMD levels, and wherein the patterned dielectric buffer layer improves adhesion of the upper IMD layer to the patterned upper conductive line stack.

2. The method of claim 1, wherein the upper conductive line thickness is about 5-12 times greater than the lower conductive line thickness.

3. The method of claim 1, wherein the upper IMD thickness is about 4-12 times greater than the lower IMD thickness.

4. The method of claim 1 further comprises forming a pad level over the upper IMD layer.

5. The method of claim 1, wherein the dielectric buffer layer comprises a silicon oxynitride layer.

6. The method of claim 1, wherein a buffer layer thickness of the dielectric buffer layer is about 30 nm.

7. The method of claim 1, wherein forming at least one upper IMD level comprises forming a plurality of upper IMD levels.

8. The method of claim 7 further comprises forming a pad level over an uppermost of the upper IMD levels.

9. A device comprising:
a substrate configured with FEOL components; and
a back-end-of-line (BEOL) dielectric comprising a plurality of intermetal dielectric (IMD) levels, wherein the BEOL dielectric includes an upper IMD level over lower IMD levels, wherein the lower IMD levels comprise lower conductive lines, wherein the upper IMD level comprises,
a patterned upper conductive line stack on an uppermost lower IMD level, wherein the patterned upper conductive line stack comprises
a patterned upper conductive line having an upper conductive line thickness which is greater than a lower conductive line thickness of the lower conductive lines of the lower IMD levels, and
a patterned dielectric buffer layer disposed on a top surface of the patterned upper conductive line, wherein exposed side surfaces of the patterned upper conductive line are aligned with exposed side surfaces of the patterned dielectric buffer layer, and
an upper IMD layer disposed over the patterned upper conductive line stack and over the uppermost lower IMD level, the upper IMD layer comprises a single dielectric layer which directly contacts a top surface of the patterned dielectric buffer layer and the exposed aligned side surfaces of the patterned dielectric buffer layer and the patterned upper conductive line, wherein the patterned dielectric buffer layer improves adhesion of the upper IMD layer to the patterned upper conductive line.

10. The device of claim 9, wherein the thickness of the upper conductive line is about 5-12 times greater than the lower conductive line thickness.

11. The device of claim 9, wherein the upper IMD layer comprises an upper IMD thickness which is about 4-12 times greater than a lower IMD thickness of lower IMD layers of the lower IMD levels.

12. The device of claim 9 further comprises a pad level over the upper IMD layer.

13. The device of claim 9, wherein the dielectric buffer layer comprises a silicon oxynitride layer.

14. The device of claim 9, wherein a buffer layer thickness of the dielectric buffer layer is about 30 nm.

15. The device of claim 9, wherein the upper IMD level comprises a plurality of upper IMD levels.

16. The device of claim 15 further comprises a pad level over an uppermost of the upper IMD levels.

17. A method of forming a device comprising:
forming an upper conductive line stack on an uppermost lower IMD level of a back-end-of-line (BEOL) dielectric of a substrate of the device, wherein the upper conductive line stack comprises
an upper conductive line, and
a dielectric buffer layer disposed on a top surface of the upper conductive line, wherein exposed side surfaces of the upper conductive line are aligned with exposed side surfaces of the dielectric buffer layer; and
forming an upper IMD layer covering the upper conductive line stack, the upper IMD layer comprises a single dielectric layer which directly contacts a top surface of the dielectric buffer layer and the exposed aligned side surfaces of the dielectric buffer layer and the upper conductive line, wherein the dielectric buffer layer improves adhesion of the upper IMD layer to the upper conductive line stack.

18. The method of claim 17, wherein the dielectric buffer layer comprises silicon oxynitride.

19. The method of claim 17 wherein the upper conductive line comprises an upper conductive line thickness which is greater than a lower conductive line thickness of lower conductive lines of lower IMD levels of the BEOL dielectric.

20. The method of claim 17 wherein the upper IMD layer has an upper IMD thickness which is thicker than a lower IMD thickness of lower IMD layers of lower IMD levels of the BEOL dielectric.

* * * * *